US008879116B2

(12) United States Patent
Grier

(10) Patent No.: US 8,879,116 B2
(45) Date of Patent: Nov. 4, 2014

(54) HOLLOW DOT PRINTING APPARATUS AND METHODS

(75) Inventor: William Grier, Highland, CA (US)

(73) Assignee: Airdye Intellectual Property, LLC, Willimington, DE (US)

( * ) Notice: Subject to any disclaimer, the term of this patent is extended or adjusted under 35 U.S.C. 154(b) by 231 days.

(21) Appl. No.: 12/701,976

(22) Filed: Feb. 8, 2010

(65) Prior Publication Data

US 2010/0136295 A1 Jun. 3, 2010

Related U.S. Application Data

(63) Continuation-in-part of application No. 11/543,449, filed on Oct. 4, 2006, now abandoned.

(60) Provisional application No. 60/724,408, filed on Oct. 7, 2005.

(51) Int. Cl.

*G06K 1/00* (2006.01)
*G03F 3/10* (2006.01)
*B41J 3/407* (2006.01)
*B41M 5/025* (2006.01)
*B41M 5/382* (2006.01)

(52) U.S. Cl.

CPC ............... *B41J 3/4078* (2013.01); *B41M 5/025* (2013.01); *B41M 5/38257* (2013.01)

USPC ............................................ 358/1.9; 358/527

(58) Field of Classification Search

USPC .......................................... 358/527, 406, 1.9

See application file for complete search history.

(56) References Cited

U.S. PATENT DOCUMENTS

| | | | | |
|---|---|---|---|---|
| 4,404,574 | A | 9/1983 | Burwasser et al. | |
| 5,255,085 | A * | 10/1993 | Spence | 358/527 |
| 5,663,030 | A | 9/1997 | Malhotra | |
| 6,532,082 | B1 * | 3/2003 | Dewitte | 358/3.3 |

FOREIGN PATENT DOCUMENTS

| | | |
|---|---|---|
| WO | 99/10183 | 3/1999 |

* cited by examiner

*Primary Examiner* — Charlotte M Baker

(74) *Attorney, Agent, or Firm* — Fish & Tsang, LLP

(57) ABSTRACT

Systems, processes, and methods are presented for creating dots that implode, rather than explode when transformed into a dye-laden gas. Each of the dots can have a smaller cross-section on a target than on the source, and each can have a concave silhouette. The dots can also have a ring-shaped surface prior to transfer to a source, such as a transfer paper. It is further contemplated that a device including, for example, a high resolution printer or an electrostatic printer, can be used to create the dots or transfer the dots to a fabric. Preferably, the dots can be transferred to a fabric or other material including, for example, clothing fabric, wall paper fabric, carpet, paper, plastic, and powder-coated metal.

11 Claims, 10 Drawing Sheets

HOLLOW DOT PRINTING APPARATUS AND METHODS

This application is a continuation-in-part of co-pending U.S. Utility application having Ser. No. 11/543,449 filed on Oct. 4, 2006, which claims priority to U.S. Provisional Application having Ser. No. 60/724,408 filed on Oct. 7, 2005. This and all other extrinsic materials discussed herein are incorporated by reference in their entirety. Where a definition or use of a term in an incorporated reference is inconsistent or contrary to the definition of that term provided herein, the definition of that term provided herein applies and the definition of that term in the reference does not apply.

FIELD OF THE INVENTION

The field of the invention is dyeing and printing of material.

BACKGROUND

Process printing developed as a solution for printing many copies of an item, including glossy magazines, posters and so forth, in a single process on substantially hard and flat surfaces. During process printing, a full or multicolor original is reproduced through the use of several (usually between two and four) halftone plates. The colors typically used are cyan, magenta, yellow, and black, which are known as CMYK process colors. Process printing has allowed for a variety of vibrant and vivid colors to be used in the print and publication industries. Unfortunately, process printing cannot be readily applied to print on fabrics because of the technical challenges and commercial difficulty that arise in precisely positioning process color dots on a moving piece of stretching cloth. Previous attempts at process printing on fabrics typically have required too much time and effort to achieve a satisfactory product.

U.S. Patent Appl. No. 2005/0025520 to Murakami discusses an image forming apparatus that can produce spherically-shaped toner such that any toner that is not transferred during the printing process can be more easily removed from the latent image bearing member. U.S. Patent Appl. No. 2002/0083855 to Samworth discusses methods of creating printing plates with ink cells having both solid and halftone areas. However, both Murakami and Samworth fail to contemplate solutions to the problems associated with process printing.

One known solution for fabric printing is to use conventional sublimation technology, in which all of the CMYK process colors are printed on a donor paper in a single pass. The image can then be transferred from the donor paper to a target fabric using heat and pressure, i.e. sublimation. Although sublimation printing works reasonably well for certain images and fabrics, the sublimation process can be difficult to employ because different types of fabrics, and even different pieces or constructions of the same fabric, can have different reactions to the various dyes and inks. In addition, sublimation printing on fabrics generally is limited to relatively low resolutions (e.g., less than 400 dpi) because the colored dots tend to expand into one another resulting in dot gain. Dot gain can occur at each place where ink is placed on the paper, and results in a dot size that is larger than the specified dot size. For example, as a paper absorbs fountain pen ink, the ink spreads from whatever lines are drawn. Depending on the absorbency of the paper, the distance that the ink could spread can vary. Thus, while a printer might specify a specific dot size, the dot as printed can sometimes be 15% to 20% larger.

While dot gain might itself be insignificant, when four layers of a color separation are combined into one print, the dot gain can increase the measured tint value during prepress, plate making, printing and transfer, substantially change the final color(s) of the image, and usually degrade the image quality. Dot gain is especially problematic for sublimation printing, in which the massive dot gain that occurs during the gas transfer of dye from the donor paper to the receiving fabric can cause the dots to overlap at about 50% saturation, and therefore negate the available colors produced by process color printing. Dot gain makes images look darker than they should, and when printing in process color, can cause unwanted color shifts and loss of subtlety in photographic prints. Furthermore, dot gain in standard four color process sublimation reduces the colors available to less than a commercially viable palette.

Although simple to understand, dot gain is an extremely difficult problem to address. Among other things, the amount of dot gain during sublimation printing can vary in different stages and for a variety of reasons, including differences in donor papers, inks and final substrates. Although standard printing technology has developed compensation curves and techniques for dealing with relatively small dot gain, such as less than 20%, even small dot gain can be too much for conventional technology to deal with.

One solution to compensate for dot gain is to print using smaller dots on any given fabric as shown in U.S. Pat. No. 7,073,902 to Codos et al. The Codos solution is problematic because the dot gain percentage increases with the number of dots printed, which can result in undesirable dot gain especially for high resolution printing.

Thus, there is still a need for apparatus and methods that reduce dot gain, and thereby allow for, among other things, high resolution sublimation printing on a variety of fabrics.

SUMMARY OF THE INVENTION

The inventive subject matter provides apparatus, systems and methods in which dots are configured such that they implode, rather than explode, when transformed into a dye-laden gas. In preferred embodiments, the dots can have one or more concavities including, for example, single concave surfaces and multiple concave surfaces (e.g., bi-concave on both surfaces, or opposing concavities). In some contemplated embodiments, the dots can be sized and dimensioned such that they have a concave silhouette profile. It is further contemplated that the plurality of dots on the donor can each have a ring-shaped surface. However, any commercially suitable dot configuration can be used such that the dots implode upon transfer.

Unless the context dictates the contrary, all ranges set forth herein should be interpreted as being inclusive of their endpoints and open-ended ranges should be interpreted to include only commercially practical values. Similarly, all lists of values should be considered as inclusive of intermediate values unless the context indicates the contrary.

Preferably, the dots are created using an electrostatic machine or a high resolution printer, although any commercially suitable methods or devices could be used including, for example, an offset press and a rotogravure press.

In other contemplated embodiments, a printing device can be provided that prints an image by transferring a plurality of the implosive dots from a source such as a transfer paper to a receiver. Preferably, the dots are transferred in a gaseous form. All printing devices are contemplated including, for example, those devices described above, sublimation printing devices, and combinations thereof. In such embodiments, the dots can have a smaller cross-section on the receiver than on the source, and each can have a concave silhouette.

It is preferred that the printing device can also be used to transfer the dots to a fabric. Preferred fabrics are clothing fabrics, but any commercially suitable fabrics can be used including, for example, wall paper fabrics, carpets, papers, plastics, and powder coated metals. In some embodiments, the dots could be transferred while the fabric is moving.

The plurality of dots can have different colors, and preferably four or more colors, such that any color combination can be made.

Various objects, features, aspects and advantages of the inventive subject matter will become more apparent from the following detailed description of preferred embodiments, along with the accompanying drawing figures in which like numerals represent like components.

DETAILED DESCRIPTION

Figure 1A:
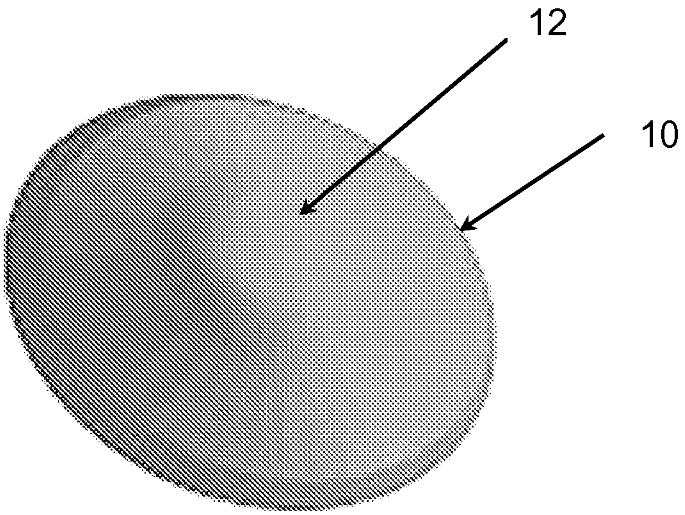
Figure 1A Prior Art
FIGS. 1A-1B are perspective and cross-sectional views, respectively, of a traditional dot.
Figure 1B:
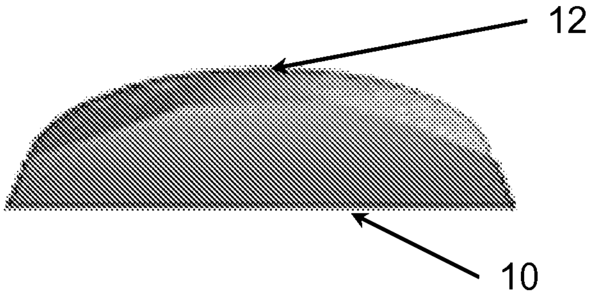
Figure 1B Prior Art
Figure 2:
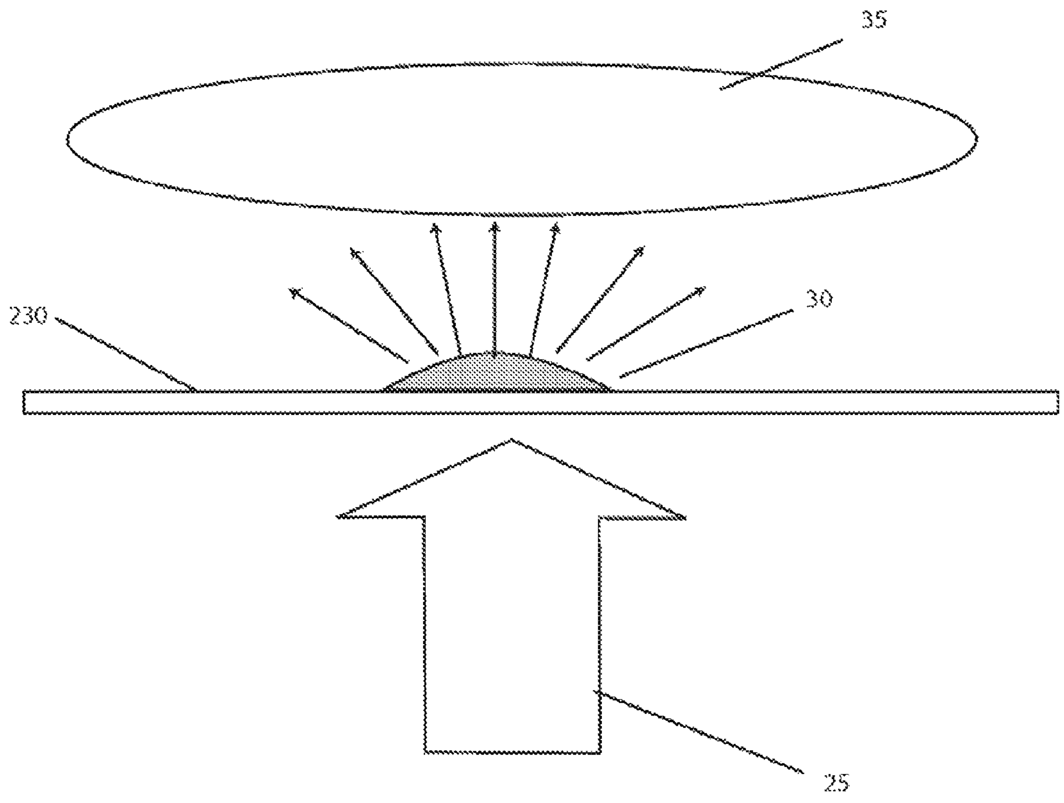
Figure 2 Prior Art
FIG. 2 is a diagram of showing the explosion of a traditional dot during heating.

In Prior Art FIGS. 1A-1B, a traditional dot 10 is shown, which has a convex silhouette and a round and full middle portion 12. As shown in Prior Art FIG. 2, when heat 22 is applied to a traditional dot 20, the traditional dot 20 expands and thereby increases the surface area 24 of the resulting dot on a transfer paper or other material, as compared with the surface area of the dot 20 on a donor 26 or other material. This expansion produces dot gain and its many disadvantages discussed above.

Figure 3A:
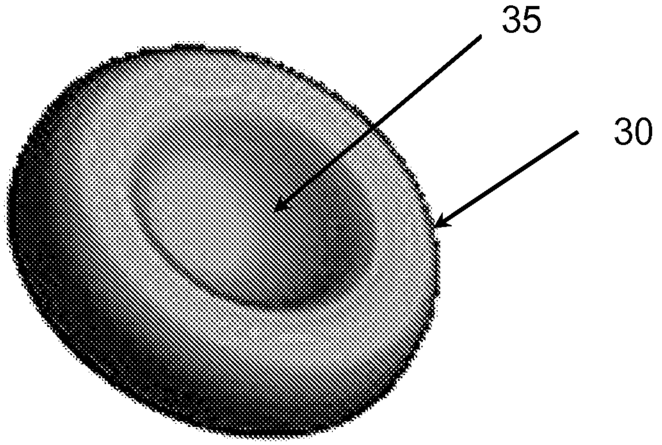
FIGS. 3A-3B are perspective and cross-sectional views, respectively, of one embodiment of an implosive dot.
Figure 3B:
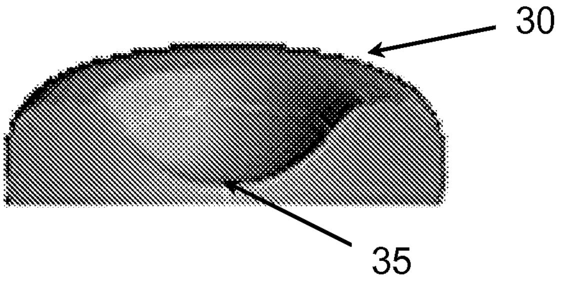

FIGS. 3A-3B illustrate one embodiment of an implosive dot 30 having a concave portion 35. As used herein, the term "implosive dot" means a dot having a greater amount of dye at an outer portion of the dot relative to an inner portion, and can include, for example, dots having a hollow interior portion, dots having one or more concavities, any combination(s) thereof, and any other commercially suitable configurations. It is also contemplated that the implosive dot can have a ring-shaped surface, bi-concavities, or other commercially suitable configurations such that the dot implodes rather than explodes at a predefined temperature. It is further contemplated that the implosive dot 30 can have a limited concavity to obtain different levels of dye effect on a receiver.

Figure 4:
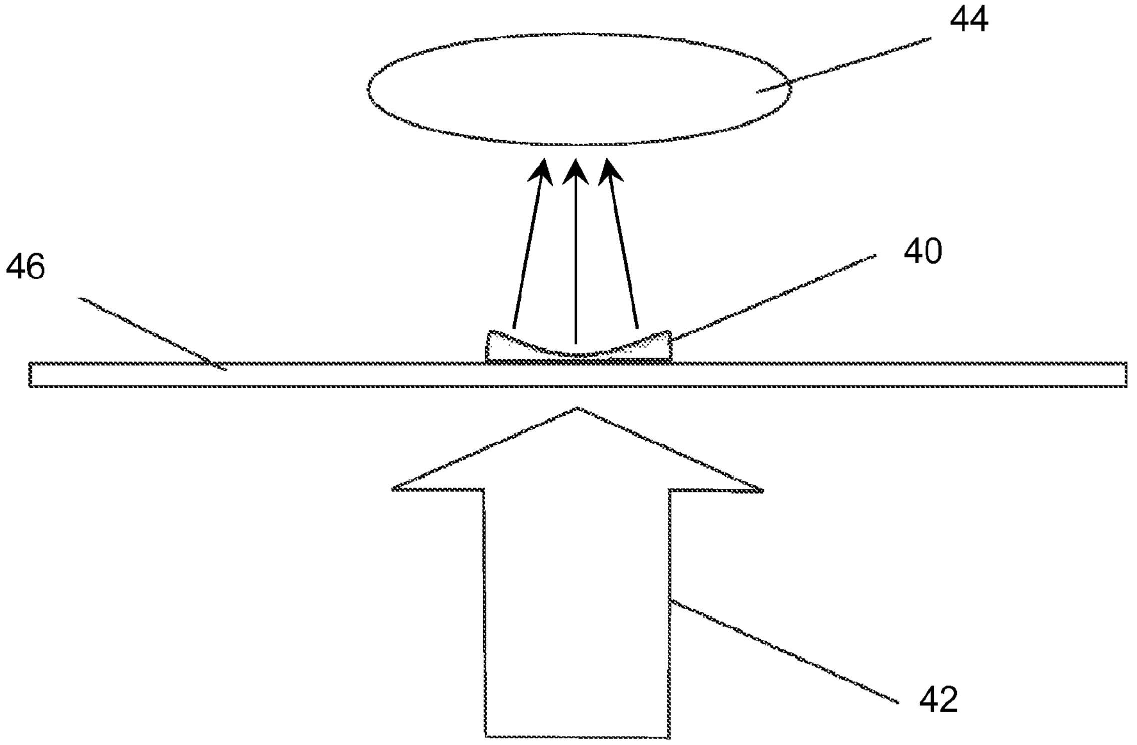
FIG. 4 is a diagram of another embodiment of an implosive dot during heating.
Figure 5:
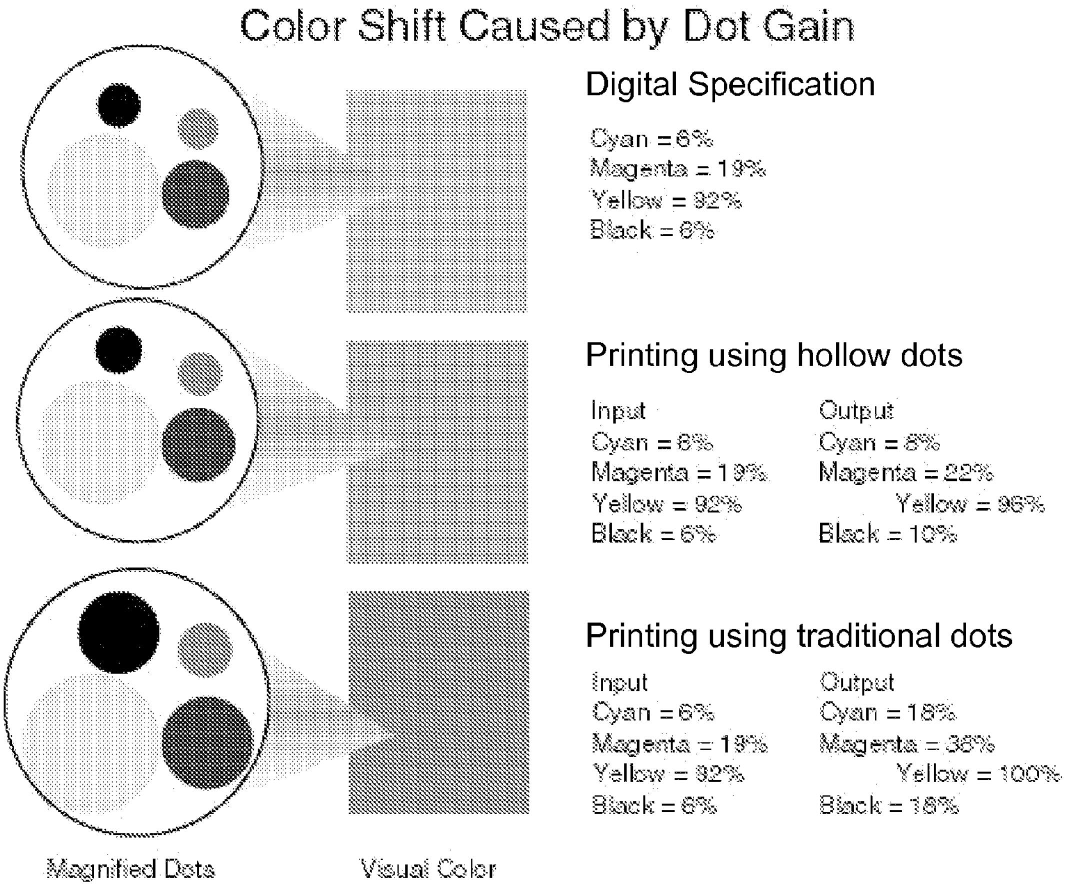
FIG. 5 is an illustration comparing the resulting dot gain between using implosive dots and traditional dots.

In FIG. 4, a heat source 42 can be used to transform an implosive dot 40 on a donor material 46 from a solid state to a gaseous state. Instead of exploding the gas-laden dye, the dot 40 implodes at a defined temperature, resulting in a decreased surface area 44 of the dot 40 on a transfer paper or other material and a reduced dot gain effect. This is advantageous, as compared with the characteristics of a standard dot 20 shown in FIG. 2, which expands when heated and diffuses in all directions to create a greater surface area 24 and dot gain effect than the surface area 44 and gain effect from the implosive dot 40. An example of the reductions in dot gain when printing with implosive dots compared with traditional dots is shown in FIG. 5.

The reduction in dot gain effect advantageously allows for a more direct application of the dye without the problems associated with excess dot gain. By utilizing implosive dots, multiple color dyes can be rolled and released at the same time to a receiver and yet the resulting dot gain remains small.

Preferred dots 40 on a donor material 46 are no larger than 1/400th of an inch in radius, or 400 dpi, and preferred dots on a receiver are no larger than 1/350th of an inch in radius, or 350 dpi.

In some contemplated embodiments, the dot 40 can react or form an affinity with certain fiber surfaces once heated. Using dots having dye-based formulations, the heat source 42 can cause dye within the dots 40 to change from a solid state to a gas state. The heat from the heat source 42 can also open pores in a polyester fiber or other receiver shown in FIG. 9B, which can allow the gaseous dye to enter, and be set within the receiver. The heat can also cause the dye to enter a molecular form which is more reflective and capable of producing more brilliant colors on the receiver. Once the material cools, the dye can be trapped internally in the receiver, and can revert back to their solid state or be fixed in the receiver's fibers. In this manner, the dye becomes part of the receiver's interior and is not affected by normal washing or bleaching.

The implosive dot 40 can comprise concentrated ink of any color, but preferably comprises a color within the CMYK color palette. It is contemplated that conventional ink jet printers can be used to jet ink and form the dots at a conventional rate, or preferably at a rate of 75 picoliters, or approximately 80 nanograms, per drop, for each of four colors in the CMYK color palette. Upon heating the dot 40 from a heat source 42, the implosive dot 40 can implode the ink from a donor material 46 to a receiver then to a tissue as shown in FIG. 9B. Due to the dot's concave silhouette, the dot gain effect of the dot 40 can be reduced from 20% to as little as 2%, as shown in FIG. 5 and discussed below.

Figure 6A:
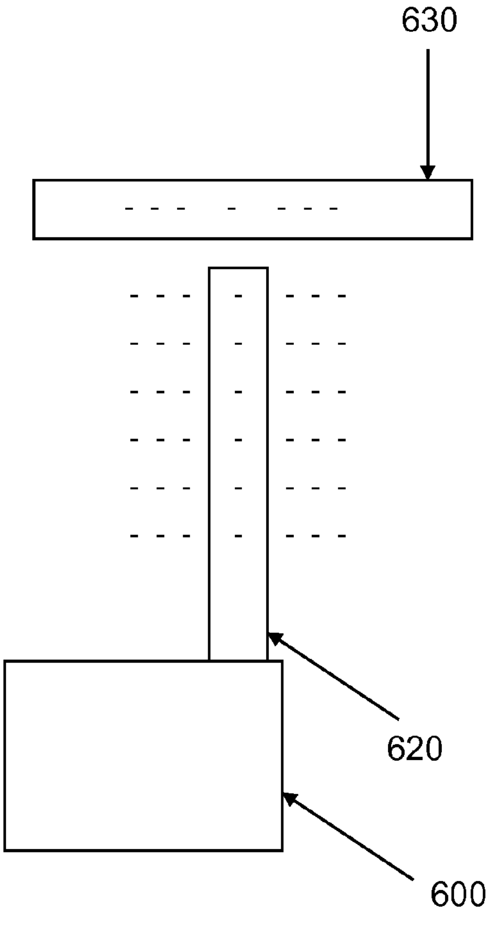
FIG. 6A is a cross-sectional view of an electrostatic machine applying a charge to a receiver.
Figure 6B:
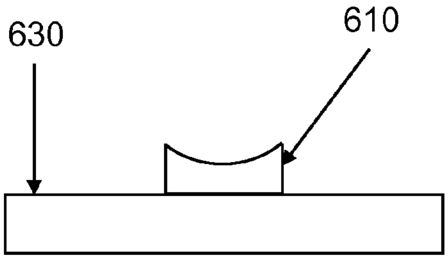
FIG. 6B is a cross-sectional view of an embodiment of an implosive dot formed from the use of an electrostatic machine.
Figure 7A:
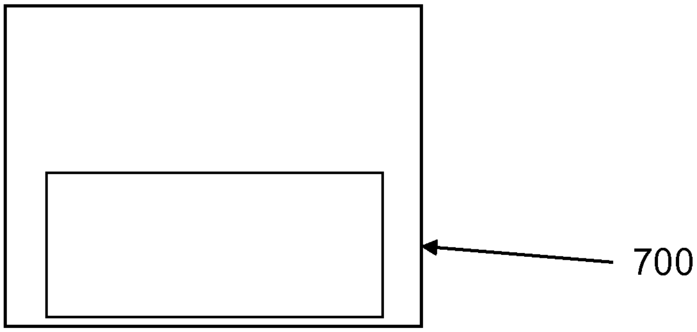
FIG. 7A is a side perspective view of a high-resolution printer.
Figure 7B:
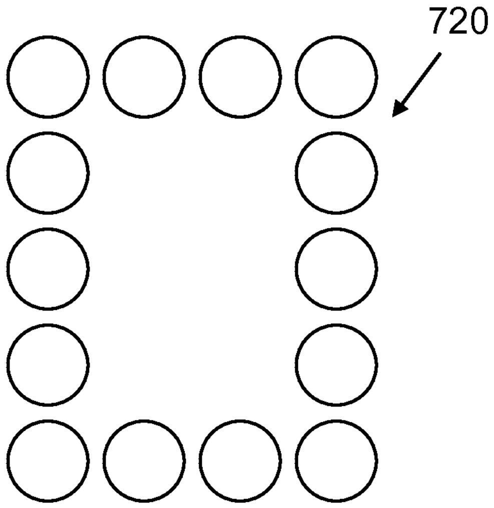
FIG. 7B is a top perspective view of a grid arrangement of donor.
Figure 7C:
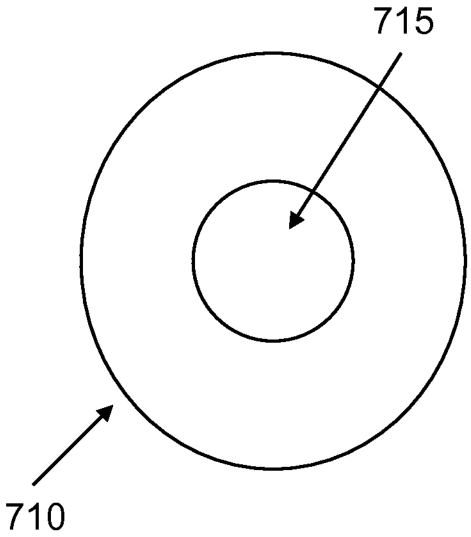
FIGS. 7C and 7D are top and side perspective views, respectively, of another embodiments of an implosive dot formed from the arrangement of donor in FIG. 7B.
Figure 7D:
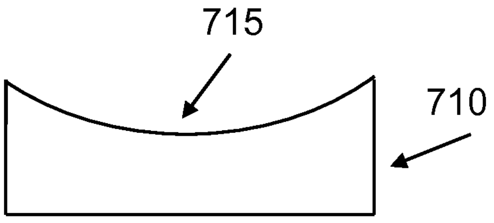

A simplified illustration of an electrostatic machine 600 is shown in FIG. 6, which can be used to create the implosive dots 610 by depositing a charge from a wire or other electrode 620 on to a receiver 630. In this manner, charged portions of the receiver 630 attract donor, such that the greater the charge at each point on the receiver 630, the greater the amount of donor that collects at each point, and vise versa. A detailed discussion of electrostatic printing can be found in U.S. Pat. No. 5,663,030 to Malhotra and U.S. Pat. No. 4,404,574 to Burwasser, et al.

The properties of the electrode 620 advantageously provide for a lower charge to be deposited from the center of the electrode 620 than from its outer area. Thus, a higher proportion of donor will be attracted to the outer area of a charged point of the receiver 630 than its center. By creating a plurality of such charged areas, a plurality of implosive dots 610 can be formed on the receiver 630.

In other contemplated embodiments shown in FIGS. 7A-7D, a high resolution printer 700 can be used to create the implosive dots 710. As used herein, the term "high resolution printer" means an output device capable of a resolution of at least 1,000 dots per inch ("dpi"). Donor can be deposited at various points to form a grid or other suitable arrangement that has one or more points in which donor is not deposited. Preferably, the points lacking donor are located in a central area of the grid. For example, a 4×5 grid 720 shown in FIG. 7B could be used in which donor is not placed in any of the central six points, although other grid configurations and other arrangements of donor are also contemplated. Because of the lack of donor in the central area of the grid arrangement, the expansion of the donor results in a dot 710 shown in FIGS. 7C and 7D that has a concavity 715 with a greater proportion of donor in its outer area than its center.

Figure 8A:
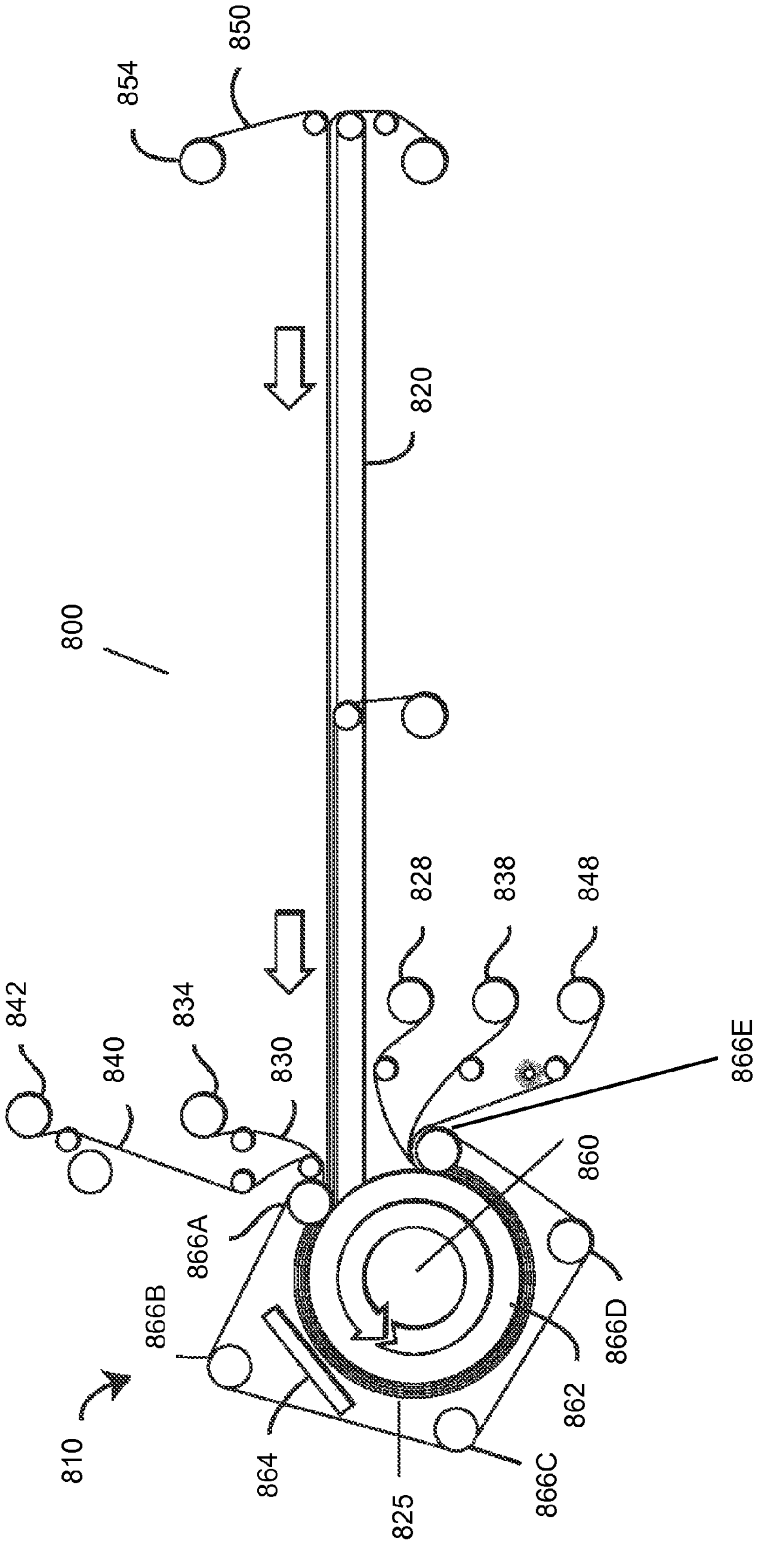
FIG. 8A is a schematic of a sublimation printing device.

In FIG. 8A, exemplary process equipment 800 can include a heating portion 810 and a work table 820. Positioned on the machine is a continuous work piece 825 (also shown in FIG. 8B) comprising: (a) a donor material 830 with a corresponding donor feed roll 834 and donor take up roll 838; (b) a tissue 840 with corresponding tissue feed roll 842 and tissue take up roll 848; and (c) a receiver 850 with corresponding receiver feed roll 854 and receiver take up roll 858. To simplify the drawing, FIG. 8 should be interpreted generically as including all such combinations. However, other commercially suitable printing devices could also be used to transfer the implosive dots to a receiver or other material.

Figure 8B:
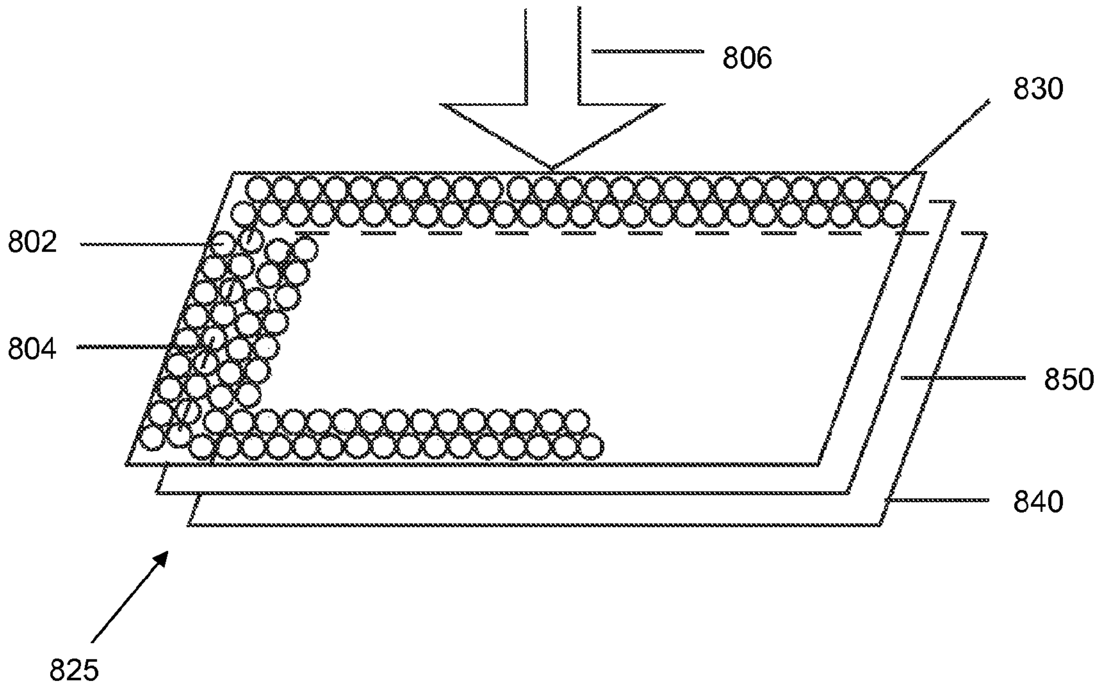
FIG. 8B is a schematic drawing of a donor material having a plurality of implosive dots.

As shown in FIGS. 8A-8B, the implosive dots 802 on the donor material 830 can pass through a heating portion 860 for sublimation printing. The heating portion 860 can include a rotary primary heating element 862, a fixed heating element 864, and a heat conductive web 866A-E. The rotation speed, configuration and dimensions of the heating portion 860 determine the dwell time of sublimating heat upon the sandwiched work piece 825 of donor material(s) 830, receiver 850 and tissue 840. Thus, it is contemplated that heat sufficient to sublimate the dyes could be applied from at least one side of the receiver for at least 5 seconds, more preferably at least 10 seconds, 20 seconds, 40 seconds, or 60 seconds, and most preferably at 80 seconds, although heating times between 5 seconds to 3 minutes could be used. Although preferred temperatures are no more than 400° F. (204.4° C.), specific temperatures will depend on the specific application.

Heating by forced hot air is preferred, although any commercially suitable heat sources including, for example, infrared heaters, can be used such that the heat adequately penetrates the fabric to the depth of the ink. In addition to heat, other mechanisms could be used for setting the dye, depending on the particular dyes and substrate combinations used.

Preferred sublimation processes are continuous with the dots being transferred to a moving fabric, but discontinuous processes could also be used including, for example, with sandwiched work pieces being assembled, and heat and pressure applied in a piece by piece manner. In that manner, the receiver could be cut from a bulk material. In addition, existing machines (e.g., Monti Antonio™, Practix™ and other cylinder-based machines) could be modified to operate according the inventive subject matter described herein.

Preferably, the donor material 830 comprises a plurality of implosive dots 802 that contains dyes 804 as shown in FIG. 8B. The donor material 830 can be any thin sheet that is substantially impassible to dye from side to side, but which has a surface to which a dye can be temporarily held. The donor material 830 can be selected from any commercially suitable donor papers including, for example, inkjet, electrostatic, or conventional substrates from Sihl™, Georgia-Pacific™, AW Specialty™, Arlon™ and other paper manufacturers and suppliers. It should be appreciated that the terms "dye" and "dyes" are used in the broadest possible sense to include inks, and indeed any chemical composition that can be transferred to a receiving material to color that material. Thus, the terms "dye" and "dyes" include chemical compositions that can change color depending upon temperature or other conditions, and even chemical compositions that are colorless when applied, but turn color upon exposure to moisture, or high temperature.

Tissue 840 can be selected from known take up tissues used in the industry and can be used to absorb dyes that pass entirely through the receiver 850 and donor material 830. The tissue 840 can also serve to protect mechanical parts of the device from excess colorant.

Receiver 850 can be any material that can receive sublimation printing. This includes most especially polyesters and other synthetic polymers that absorb dyes at high temperature and pressure, with currently preferred receiver materials including, for example, the true synthetics or non-cellulosics (e.g., polyester, nylon, acrylic, modacrylic, and polyolefin), blends, and so forth. It is contemplated that the receiver could also include, for example, natural fibers (e.g., cotton, wool, silk, linen, hemp, ramie, and jute), and semi-synthetics or cellulosics (e.g., vicose rayon and cellulose acetate). Receivers can be flexible or rigid, bleached or unbleached, white or colored, woven or non-woven, knitted or non-knitted, laminated, or any combination of these or other factors. Thus, a receiver could, for example, include a woven material on one side and a non-woven or differently woven material on the opposite side. Among other things, contemplated receivers can include, for example, fabrics and fibers used for clothing, banners, flags, curtains and other wall coverings, and even carpets.

In some aspects, a representation of the image can be created on a donor material, and then hollow dots can be created corresponding to the image representation. The hollow dots on the donor material can then be transferred to a receiver upon application of sufficient heat. It is preferred that the dot representation is presented in a digital format, although other formats are also contemplated.

In one aspect, a method to print an image on a target is presented by creating a dot representation of the image, then producing physical dots corresponding to the dot representation, and transferring the physical dots to the target. Among all the contemplated possibilities, it is preferred that the dot representation is presented in a digital format. To transfer the physical dots to the target, heat can be applied to vaporize the dots.

The methods and systems disclosed herein have numerous advantages. By using implosive dots, a designer can obtain complex color prints on fabric while reducing undesired dot gain effect, and can thereby maintain color consistency in a commercially viable manner. Thus, a t-shirt designer can generate multi-color t-shirts or other materials without limiting the number of colors used or compensating for the bleeding effect traditionally associated with using multiple colors. Similarly, a carpet designer can create a carpet with multi-color hues and depths. By using implosive dots, it is also possible to increase the volume of dye without increasing the dot gain and its adverse effects. This advantageously allows the commercial imaging of heavier and more porous receivers that were previously unable to meet commercial resolution and color consistency standards. Those skilled in the art will appreciate that the inventive subject matter can be applied to any material that warrants color prints, including clothes, handbags and other accessories, furniture, fabrics to cover non-furniture spaces in automobiles and other motor vehicles, carpets, powder coated metals, plastics and so forth.

Printing complex patterns and even photographic or other images can also be possible, with third, fourth, and additional colors, since the dot gain has been greatly reduced limiting the colors from bleeding into each other.

EXAMPLES

The following example illustrates one particular embodiment of the present inventive subject matter, and aids those of skill in the art in understanding and practicing the inventive subject matter. It is set forth for explanatory purposes only, and is not to be taken as limiting the present inventive subject matter in any manner.

Example 1

Color Shift Caused by Dot Gain

Table 1 (shown below) compares the differences in measured dot gain between printing with traditional dots and hollow dots. A color based off the CMYK palette was used to print on a fabric. The traditional method of the four color CMYK process was used with normal printing and transfer dot gain. The output value of the traditional method in general saw significant amounts of dot gain effect. In fact, the average dot gain increase for the traditional method was 12.75%. In contrast, using a hollow dot printing process significantly decreased the overall dot gain effect when compared with the traditional dot gain effect. The average dot gain for the hollow dot printing process was 3.25%.

TABLE 1

| Color | Input Value | Traditional Output Value | Traditional Dot Gain (increase) | Hollow Dot Output Value | Hollow Dot Gain (increase) |
|---|---|---|---|---|---|
| Cyan | 6% | 18% | 12% | 8% | 2% |
| Magenta | 19% | 38% | 19% | 22% | 3% |
| Yellow | 92% | 100% | 8% | 96% | 4% |
| Black | 6% | 18% | 12% | 10% | 4% |

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. An implosive dot having an ink formulation, the dot comprising:

an outer portion and a hollow interior portion;

wherein the outer portion comprises the ink formulation and wherein the implosive dot is configured to have a dot gain effect of less than 8%.

2. The implosive dot of claim 1, wherein the outer portion further comprises a first surface and a second surface, and wherein the first surface comprises a first concavity.

3. The implosive dot of claim 2, further comprising a second concavity disposed on the second surface.

4. The implosive dot of claim 1, wherein the dot further comprises a first surface and a second surface, and wherein each of the first and second surfaces comprise a convexity.

5. A process of creating an implosive dot, comprising:

providing a substrate;

causing a dye to be deposited on the substrate such that an implosive dot is produced having a hollow interior portion surrounded by an outer portion; and wherein the outer portion comprises the dye.

6. A donor, comprising:

a first surface; and a plurality of dots disposed on the first surface, wherein at least one of the plurality of dots is ring-shaped, and has an ink formulation that is configured to transform into a dye-laden gas; and wherein the at least one of the plurality of dots is configured to implode when the ink formulation is at least partially transformed into a dye-laden gas.

7. The donor of claim 6, wherein the at least one of the plurality of dots comprises a dot gain effect of less than 8% when the ink formulation is transformed into a dye-laden gas.

8. A dot having an ink formulation, comprising:

a ring-shaped surface; and wherein the dot is configured to implode when the ink formulation at least partially transforms into a dye-laden gas.

9. A process of creating an implosive dot, comprising:

providing a substrate; and causing a dye to be deposited on the substrate such that an implosive ring-shaped dot is produced that has an ink formulation configured to transform into a dye-laden gas, wherein the dot is configured to implode when the ink formulation is at least partially transformed into a dye-laden gas.

10. The process of claim 9, further comprising causing the dye to be deposited using an electrostatic machine.

11. The process of claim 9, further comprising causing the dye to be deposited using a high-resolution printer.

* * * * *